United States Patent
Burton et al.

(10) Patent No.: US 6,673,687 B1
(45) Date of Patent: Jan. 6, 2004

(54) METHOD FOR FABRICATION OF A HETEROJUNCTION BIPOLAR TRANSISTOR

(75) Inventors: Richard S. Burton, Newbury Park, CA (US); Apostolos Samelis, Simi Valley, CA (US); Kyushik Hong, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/190,011

(22) Filed: Jul. 5, 2002

Related U.S. Application Data

(62) Division of application No. 10/034,880, filed on Dec. 27, 2001, now Pat. No. 6,531,721.

(51) Int. Cl.⁷ .......................................... H01L 21/8222
(52) U.S. Cl. ........................ 438/312; 438/317; 438/320
(58) Field of Search ................................ 438/312, 313, 438/317, 320, 321; 257/197, 198, 200

(56) References Cited

U.S. PATENT DOCUMENTS 5,106,766 A * 4/1992 Lunardi et al. ............. 438/312
5,270,223 A * 12/1993 Liu ............................ 438/312
5,603,765 A * 2/1997 Matloubian et al. ......... 117/94
6,335,255 B1 * 1/2002 Evaldsson et al. .......... 438/314

* cited by examiner

Primary Examiner—Tuan H. Nguyen
(74) Attorney, Agent, or Firm—Farjami & Farjami LLP

(57) ABSTRACT

According to one disclosed embodiment, a heavily doped subcollector is formed. Subsequently, a collector is fabricated over the heavily-doped subcollectoi, wherein the collector comprises a medium-doped collector layer adjacent to the subcollector and a low-doped collector layer over the medium-doped collector layer. Both the medium-doped collector layer and the low-doped collector layer can comprise gallium-arsenide doped with silicon at between approximately $5 \times 10^{16}$ cm$^{-3}$ and approximately $1 \times 10^{18}$ cm$^{-3}$, and at between approximately $1 \times 10^{16}$ cm$^{-3}$ and approximately $3 \times 10^{16}$ cm$^{-3}$, respectively. Thereafter, a base is grown over the collector, and an emitter is deposited over the base. The collector of the HBT prevents the depletion region from reaching the subcollector without unduly impeding the expansion of the depletion region. As a result, filamentation in the subcollector is prevented, but the HBT's performance remains optimal.

27 Claims, 5 Drawing Sheets

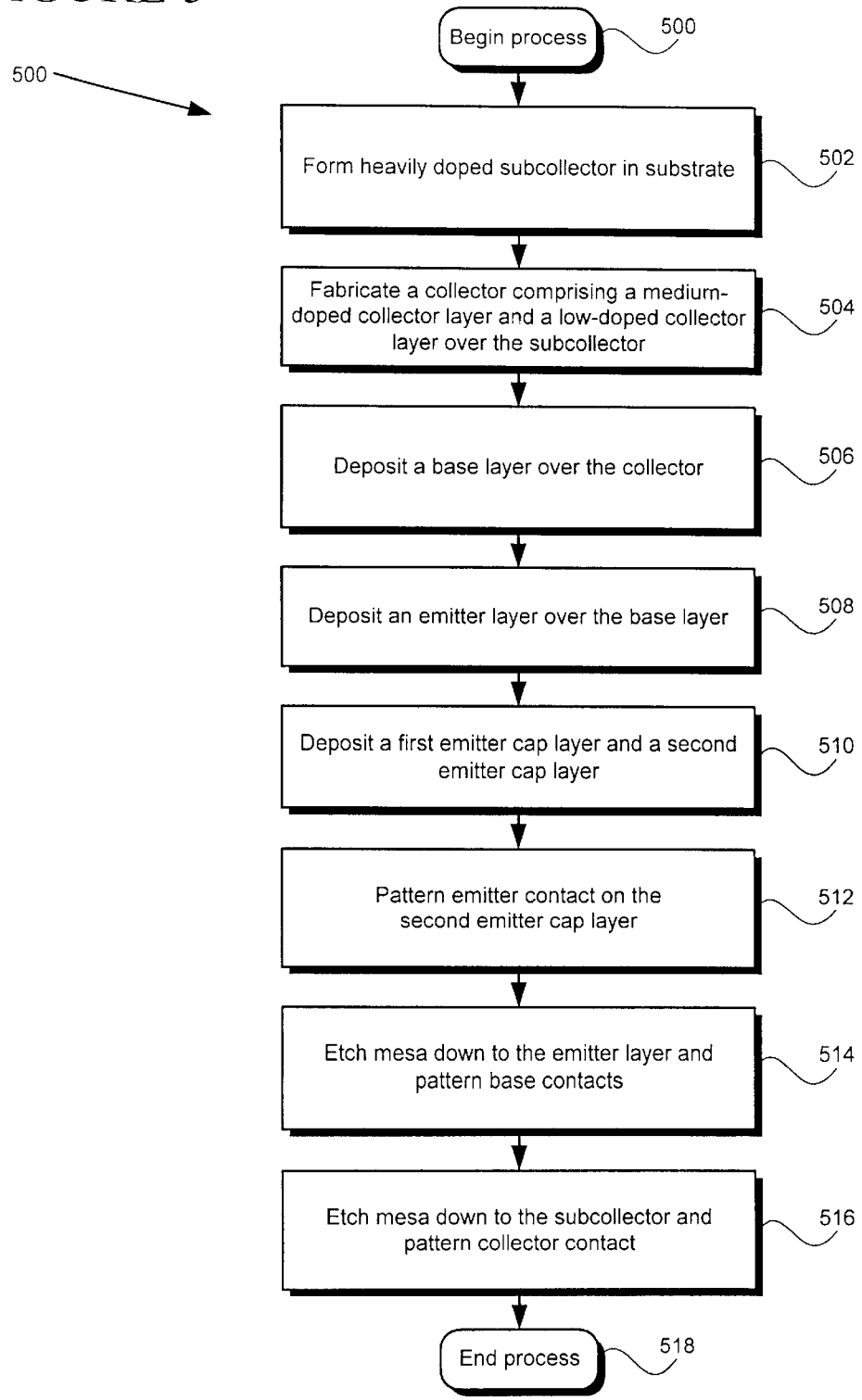

US 6,673,687 B1

METHOD FOR FABRICATION OF A HETEROJUNCTION BIPOLAR TRANSISTOR

This is a divisional of application Ser. No. 10/034,880 filed Dec. 27, 2001, now U.S. Pat. No. 6,531,721.

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

GaAs-based devices are able to provide the power and amplification requirements of wireless communication applications with improved linearity and power efficiency. Of particular interest are gallium-arsenide ("GaAs") heterojunction bipolar transistors ("HBT"), which exhibit high power density capability, making them suitable as low cost and high power amplifiers in devices used in CDMA, TDMA and GSM wireless communications. The NPN gallium-arsenide HBT has significant advantages in speed, frequency response, and breakdown when compared to a conventional silicon bipolar transistor. The higher breakdown, speed and frequency response of the gallium-arsenide NPN HBT are possible due to certain advantages of gallium-arsenide, such as a large band gap and high electron mobility. Gallium-arsenide has a bandgap of 1.424 eV compared to 1.1 eV for silicon, and its electron mobility is on the order of 5000–8000 cm$^2$/(V-sec) as compared to 800–2000 cm$^2$/(V-sec) for silicon. As a result, GaAs devices can achieve a significantly greater gain bandwidth product and breakdown at comparable frequencies and input powers to silicon devices.

It is known that when an NPN gallium-arsenide HBT is inactive, a space charge layer is present at the P-N, collector-base junction, due to the diffusion of majority carriers across the P-N interface. Without applied voltage, the width of the space charge layer, i.e. the "depletion region", is relatively narrow. Further, the electric field across the depletion region resulting from the migration of the majority carriers is relatively weak. However, when a reverse voltage is applied to the collector-base junction, i.e. when the collector-base junction is reversed biased, the electric field is strengthened, and the depletion region is correspondingly widened, with the edge of the depletion region extending further and further into the collector. The electric field strength and the collector depletion region width are directly related to the applied reverse voltage.

It is further known that electrons injected from the emitter into the base are accelerated across the depletion region by the electric field to the collector where they are "collected." The strength of the electric field across the depletion region determines the energy of the electrons traveling through the collector-base junction. Therefore, if the reverse voltage applied to the junction is raised, the electric field is strengthened, and the energy of the electrons increases correspondingly.

At a certain voltage referred to generally as "breakdown voltage," many of the electrons traveling across the collector-base junction attain sufficient energy that through collisions, electron-hole pairs are generated in the depletion region. The collision-created holes and electrons contribute to the reverse current, i.e. the current flowing from collector to base, and a very rapid increase in the reverse current results. Provided that the device's maximum power dissipation limits are not exceeded, the "breakdown" which occurs as a result of the rapid increase in the current does not necessarily lead to catastrophic failure of the HBT. However, the heat generated and the resulting rise in temperature could threaten the operation of the device.

Referring now to FIG. 1, an NPN gallium-arsenide HBT fabricated utilizing conventional fabrication methods is illustrated. Gallium-Arsenide ("GaAs") HBT 100 comprises emitter contact 120, base contacts 122 and 124, and collector contact 126. Further, GaAs HBT 100 comprises emitter cap 118, emitter cap 116, emitter 114, and base 112. In a typical GaAs HBT, emitter cap 118 is indium-gallium-arsenide ("InGaAs") doped with tellurium at about $1 \times 10^{19}$ cm$^{-3}$, for example, while emitter cap 116 is gallium-arsenide doped with silicon at approximately $5 \times 10^{18}$ cm$^{-3}$. Emitter 114 can comprise either aluminum-gallium-arsenide ("AlGaAs") or indium-gallium-phosphide ("InGaP") doped with silicon but at the relatively low concentration of $3 \times 10^{17}$ cm$^{-3}$. Base 112 can be, for example, gallium-arsenide doped with carbon at typically $4 \times 10^{19}$ cm$^{-3}$.

Continuing with FIG. 1, as shown, GaAs HBT 100 further comprises collector 130 and subcollector 110. According to conventional fabrication methods, collector 130 comprises gallium-arsenide, which is uniformly and lightly doped with silicon at $1 \times 10^{16}$ cm$^{-3}$. Immediately below collector 130 is subcollector 110, which is also gallium-arsenide. However, subcollector 110 is doped with silicon at a significantly higher concentration, typically in the range of $5 \times 10^{18}$ cm$^{-3}$. In GaAs HBT 100, collector layer 130 can be between 0.3 microns and 2.0 microns thick, and subcollector 110 can be between 0.3 microns and 2.0 microns thick.

As discussed above, when an NPN gallium-arsenide HBT is in the active mode, the depletion region at the collector-base junction is widened due to the electric field generated by the applied voltage. Thus, when voltage is applied to GaAs HBT 100, the narrow depletion region that formed originally at the P-N junction between base 112 and collector 130, widens. Further, as the collector voltage is gradually increased, the edge of the depletion region extends deeper into collector 130, and at a high enough voltage, the depletion region eventually reaches subcollector 110. It is known, however, that due to the significantly higher doping level of subcollector 110, the process of depleting subcollector 110 occurs much slower. Depending on the thickness and doping level of collector 130, breakdown voltage may occur by the time the edge of the depletion region nears the interface between collector 130 and subcollector 110, or after the depletion region encroaches into subcollector 110.

As a result of the depletion region extending through collector 130 and reaching the collector-subcollector interface, a strong electric field develops near heavily doped subcollector 110. The strong electric field initiates filamentation which, stated simply, is localized current that causes high power dissipation in a small area with a correspondingly high increase in the localized temperature within the device. It has been theorized that filamentation arises, for example, through localized inhomogeneties in the subcollector region from the precipitation of the dopant, e.g. silicon, in the heavily doped subcollector, through natural defects in the crystal, or perhaps through internal thermal gradients in the device. Regardless of the precise mechanism of filamentation, the end result is premature device failure.

There is thus a need in the ail for method for fabricating a gallium-arsenide HBT that minimizes the likelihood of filamentation so as to enhance the operating condition of the device.

SUMMARY OF THE INVENTION

The present invention is directed to method and structure for a heterojunction bipolar transistor. In one embodiment, the invention results in a heterojunction bipolar transistor ("HBT") with a collector that prevents the depletion region from reaching near the subcollector, thereby preventing the formation of a strong electric field at the junction between the collector and the subcollector and thereby inhibiting filamentation in the subcollector.

According to one embodiment of the invention, a heavily doped subcollector is formed. The heavily doped subcollector can comprise, for example, gallium-arsenide doped with silicon at a high concentration. Subsequently, a collector is fabricated over the heavily-doped subcollector, wherein the collector comprises a medium-doped collector layer adjacent to the subcollector and a low-doped collector layer over the medium-doped collector layer. Both the medium-doped collector layer and the low-doped collector layer can comprise gallium-arsenide doped with silicon, for example, at between approximately $5 \times 10^{16}$ cm$^{-3}$ and approximately $1 \times 10^{18}$ cm$^{-3}$ in the case of the medium-doped collector layer, and at between approximately $1 \times 10^{16}$ cm$^{-3}$ and approximately $3 \times 10^{16}$ cm$^{-3}$ in the case of the low-doped collector layer.

According to one embodiment, the collector can further comprise a medium/high-doped collector layer over the low-doped collector layer, and the medium/high-doped collector layer can comprise gallium-arsenide doped with silicon at between approximately $2 \times 10^{16}$ cm$^{-3}$ and approximately $3 \times 10^{18}$ cm$^{-3}$. Thereafter, a base is grown over the collector, and an emitter is deposited over the base. The collector of the HBT prevents the depletion region from reaching the subcollector without unduly impeding the expansion of the depletion region. As a result, filamentation in the subcollector is prevented, but the HBT's performance may be optimized for particular circuits.

Further, a HBT structure can be fabricated in which the collector comprises a medium-doped collector layer adjacent to a heavily doped subcollector. The collector also comprises a low-doped collector layer over the medium-doped collector layer. The HBT further comprises a base over the low-doped collector layer and an emitter over the base. The result is a HBT structure wherein the depletion region is impeded from reaching the subcollector, and filamentation is prevented from initiating in the subcollector.

BRIEF DESCRIPTION OF THE DRAWINGS

FIG. 5 shows a flowchart illustrating some exemplary steps taken to implement an embodiment of the invention.

DETAILED DESCRIPTION OF THE INVENTION

The present invention is directed to method and structure for a heterojunction bipolar transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely example embodiments of the invention. To maintain brevity, other embodiments of the present invention are not specifically described in the present application and are not specifically illustrated by the present drawings.

Figure 2:
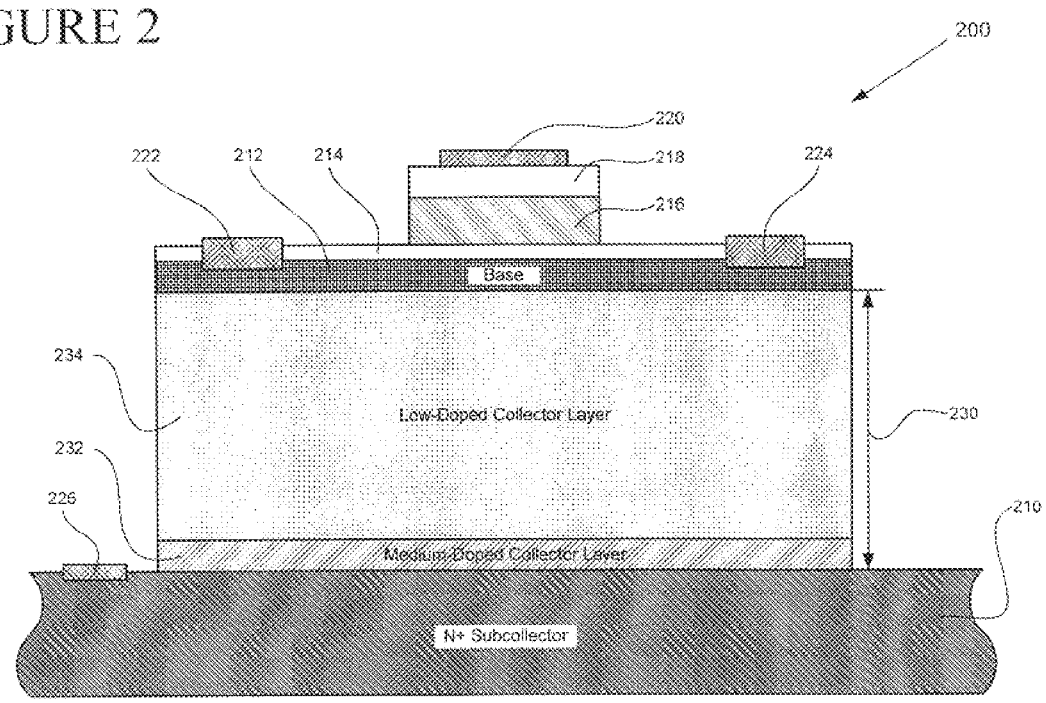
FIG. 2 illustrates a cross sectional view of some of the features of a HBT fabricated in accordance with one embodiment of the present invention.

Reference is now made to FIG. 2, which shows exemplary HBT 200. HBT 200 is an NPN gallium-arsenide ("GaAs") heterojunction bipolar transistor ("HBT") fabricated in accordance with one embodiment of the invention. Certain details and features have been left out of FIG. 2 in order to not obscure the invention, but it is appreciated that such excluded details and features are apparent to a person of ordinary skill in the art. As shown, HBT 200 comprises subcollector 210, collector 230, base 212, emitter layer 214, first emitter cap 216 and second emitter cap 218. Collector 230 consists of two separate layers, i.e. low-doped collector layer 234 and medium-doped collector layer 232. Exemplary HBT 200 also comprises emitter contact 220, base contacts 222 and 224, and collector contact 226.

Continuing with exemplary H BT 200, in the present embodiment, subcollector 210 is a highly doped N+ buried layer providing a low resistance electrical pathway from collector 230 to collector contact 226. Subcollector 210 comprises GaAs, which can be doped with, for example, silicon at between approximately $1 \times 10^{18}$ cm$^{-3}$ and approximately $6 \times 10^{18}$ cm$^{-3}$. Subcollector 210 can be between approximately 0.5 microns to approximately 1.0 micron thick. Base 212 in exemplary HBT 200 is also GaAs, doped with, for example, carbon at between approximately $1 \times 10^{19}$ cm$^{-3}$ and approximately $6 \times 10^{19}$ cm$^{-3}$, making it a P+ type base. Typically, base 212 can be between approximately 500 Angstroms to approximately 1500 Angstroms thick.

As shown in FIG. 2, situated on top of base 212 is emitter 214, which can comprise either, for example, indium-gallium-phosphide ("InGaP") or aluminum-galliumarsenide ("AlGaAs"). Emitter 214, which may be between approximately 200 Angstroms to approximately 700 Angstroms thick, can be doped with silicon at approximately $3 \times 10^{17}$ cm$^{-3}$, making emitter 214 an n-type emitter. Formed on top of emitter 214 are first emitter cap 216 and second emitter cap 218. In the present embodiment, first emitter cap 216 comprises GaAs doped with silicon at approximately $4 \times 10^{18}$ cm$^{-3}$ and is approximately 1500 Angstroms thick, while second emitter cap 218 comprises indium-gallium-arsenide ("InGaAs") doped with either silicon or tellurium at between approximately $1 \times 10^{19}$ cm$^{-3}$ and approximately $4 \times 10^{19}$ cm$^{-3}$. Those of skill in the art will appreciate that the active region for exemplary HBT 200 is the area directly beneath first emitter cap 216, i.e. the width of the active region is equal to the width of emitter cap 216. However, those of skill will also appreciate that, as shown, emitter 214 extends beyond the active region up to, for example, the HBT's base contacts where it functions as an electrically inactive "passivation" layer over base 212.

In the present embodiment, collector 230 in exemplary HBT 200 comprises low-doped collector layer 234 and medium-doped collector layer 232. Low-doped collector layer 234 comprises GaAs doped with silicon at approximately $1\times10^{16}$ cm$^{-3}$. Low-doped collector layer 234 can be between approximately 0.5 microns and approximately 1.0 micron thick. Situated beneath low-doped collector layer 234 is medium-doped collector layer 232. Medium-doped collector layer 232 is also GaAs doped with silicon but at a relatively higher doping level. In the present embodiment, medium-doped collector layer 232 is doped with silicon at between approximately $5\times10^{16}$ cm$^{-3}$ and approximately $1\times10^{18}$ cm$^{-3}$. The thickness of medium-doped collector layer 232 can be between approximately 1000 Angstroms and approximately 5000 Angstroms. It is preferable for each of the collector layers to be doped uniformly at its specified doping level. Lowdoped collector layer 234 and medium-doped collector layer 232 can be formed, or "grown," and doped in any suitable manner known in the art, for example by a molecular beam epitaxy ("MBE") process or a metalorganic chemical vapor deposition process ("MOCVD").

As shown in FIG. 2, low-doped collector layer 234 is positioned beneath base 212 in exemplary HBT 200, resulting in a collector-base junction at their interface. It is noted, therefore, that n-type emitter 214, p-type base 212 and n-type collector 230, comprising low-doped collector layer 234 and medium-doped collector layer 232, make up the NPN components of exemplary HBT 200.

Figure 1:
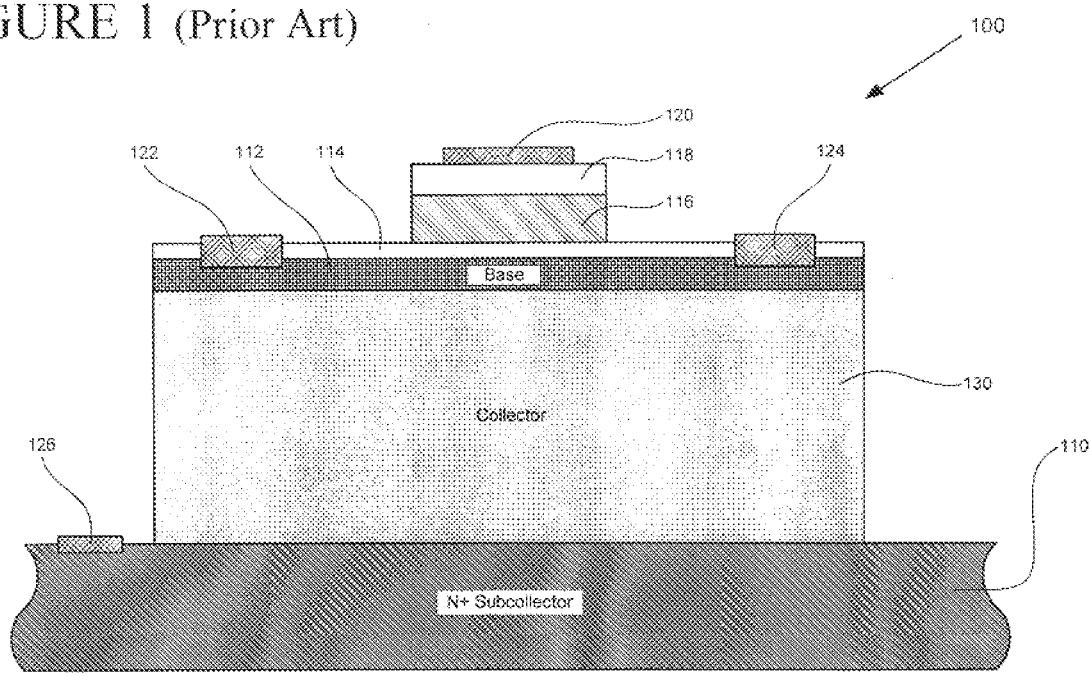
FIG. 1 illustrates a cross sectional view of some of the features of a HBT fabricated utilizing conventional methods.

Continuing with FIG. 2, it is noted that rather than having a uniformly and lightly doped collector as in conventional gallium-arsenide HBT's (e.g. see GaAs HBT in FIG. 1), the present embodiment results in a HBT wherein the collector comprises both a low-doped and a medium-doped collector layer, i.e. collector 230 comprising low-doped collector layer 234 and medium-doped collector layer 232, wherein each collector layer is uniformly doped but at a different doping concentration from each other. The purpose of medium-doped collector 232 is to impede the excessive widening of the depletion region into the vicinity of subcollector 210 and to prevent a high electric field from situating near the interface of a low-doped collector and a high-doped subcollector at breakdown voltage.

As is known in the art, and as discussed above, a strong electric field near highly doped subcollector 210 can generate filamentation in subcollector 210 and lead to premature device failure. However, a strong electric field is desirable for the purpose of accelerating electrons across the depletion region, which enhances the performance of the HBT. Also, a wide depletion region is desirable because it reduces the collector-base junction capacitance. By placing medium-doped collector layer 232 between low-doped collector layer 234 and high-doped subcollector 210, the present invention prevents the depletion region from coming too close to the subcollector at breakdown voltage, thus preventing filamentation. At the same time, the doping profile and thickness of medium-doped collector layer 232 can be engineered such that the depletion region's expansion is not overly hindered. It is desirable to have breakdown voltage to be reached, for instance, when the depletion region extends about three-quaiters of the way into medium-doped collector layer 232. Thus, FIG. 2 illustrates an exemplary NPN gallium-arsenide HBT structure having a two-layered collector, wherein a medium-doped collector layer is sandwiched between a low-doped collector layer and a high-doped subcollector, and wherein the medium-doped collector layer prevents the depletion region from getting too close to the subcollector while at the same time allowing the depletion region to expand sufficiently, resulting in superior HBT performance.

Figure 3:
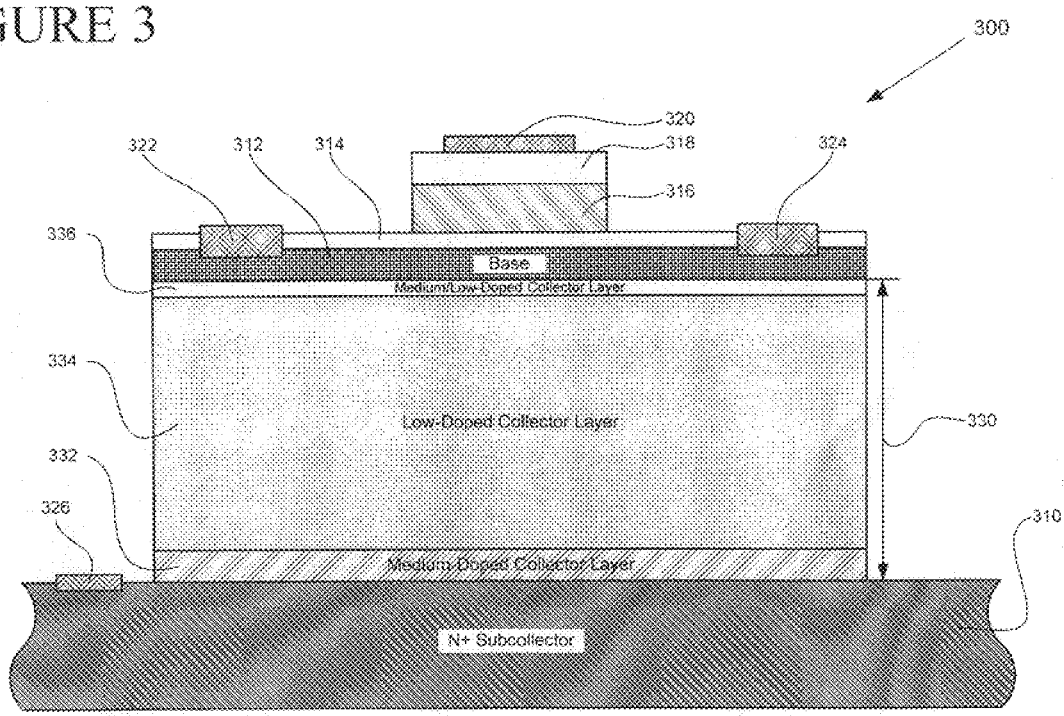
FIG. 3 illustrates a cross sectional view of some of the features of a HBT fabricated in accordance with one embodiment of the present invention.

Referring now to FIG. 3, illustrated is exemplary HBT structure 300 fabricated in accordance with one embodiment. Exemplary HBT structure 300, like exemplary HBT structure 200 in FIG. 2, is an NPN gallium-arsenide HBT. It is noted that, apart from its collector, i.e. collector 330, exemplary HBT structure 300 is identical to exemplary structure 200 of FIG. 2. As such, the various components of exemplary structure 300, apart from collector 330, possess the same characteristics, composition, and function as their counterparts in exemplary HBT structure 200.

Briefly, exemplary HBT structure 300 comprises subcollector 10, base 312, emitter 314, first emitter cap 316, and second emitter cap 318, which are respectively equivalent to subcollector 210, base 212, emitter 214, first emitter cap 216, and second emitter cap 218 of exemplary HBT structure 200. Further, emitter contact 320, base contacts 322 and 324, and collector contact 326 of exemplary HBT structure 300 are respectively equivalent to emitter contact 220, base contacts 222 and 224, and collector contact 226 of exemplary HBT structure 200.

Continuing with FIG. 3, subcollector 310 comprises gallium-arsenide highly doped with silicon, for example, at between approximately $1\times10^{18}$ cm$^{-3}$ and approximately $5\times10^{18}$ cm$^{-3}$. Subcollector 310 can be between 0.5 microns to 1.0 micron thick. As shown, collector 330 comprises three different layers, namely medium-doped collector layer 332, low-doped collector layer 334, and medium/low-doped collector layer 336. In the present embodiment, medium-doped collector layer 332 comprises gallium-arsenide doped with silicon at between approximately $5\times10^{16}$ cm$^{-3}$ and approximately $1\times10^{18}$ cm$^{-3}$, low-doped collector layer 334 is gallium-arsenide doped with silicon at between approximately $1\times10^{16}$ cm$^{-3}$ and approximately $3\times10^{16}$ cm$^{-3}$, and medium/low-doped collector layer 336 is gallium-arsenide doped with silicon at between approximately $2\times10^{16}$ cm$^{-3}$ and approximately $5\times10^{16}$ cm$^{-3}$. The thickness of medium-doped collector layer 332 can be between approximately 1000 Angstroms and approximately 5000 Angstroms, the thickness of low-doped collector layer 334 can be between approximately 0.5 microns and approximately 1.0 micron, and the thickness of medium/low-doped collector layer 336 can be approximately 500 Angstroms.

In the present embodiment, the role of medium-doped collector layer 332 is to prevent the encroachment of the depletion region into subcollector 310 prior to breakdown voltage. As already discussed, if the depletion region edge gets too close to the subcollector, filamentation can be generated due to the strong electric field, leading to premature device failure. Thus, by placing medium-doped collector layer 332 between low-doped collector layer 334 and heavily doped subcollector 310, and by controlling the doping profile and thickness of medium-doped collector layer 332, the present invention results in a superior HBT structure wherein the likelihood of filamentation and premature device breakdown is significantly reduced. It is desirable for breakdown voltage to be reached when the depletion region has extended into about three-quaitels of medium doped collector layer 332.

Continuing with FIG. 3, the purpose of having medium/low-doped collector layer 336 directly beneath base 312 is to prevent base push out, or the "Kirk" effect. Base push out occurs when the collector current rises to a level where the number of electrons entering the depletion region exceeds the background doping level. The result is that the depletion region is pushed out into the collector, increasing the base width. Ultimately, base push out leads to a decrease in current gain. By situating medium/low-doped collector layer 336 immediately beneath base 312, i.e. at the collector-base junction, and by controlling the doping profile and thickness of medium/low-doped collector layer 336, the electric field at the collector-base junction is modified, and base push out can be prevented.

Thus, FIG. 3 illustrates an exemplary NPN gallium-arsenide HBT structure having a three-layered collector, wherein a medium-doped collector layer is sandwiched between a low-doped collector layer and a heavily doped subcollector so as to prevent the depletion region from expanding into the subcollector and initiating filamentation. However, the doping profile of the medium-doped collector layer is such that the depletion region is allowed to expand sufficiently to enhance the transistor's performance. The HBT illustrated in FIG. 3 further comprises a medium/low-doped collector layer directly below the base, which modifies the electric field at the collector-base interface to prevent base push out and hence optimize the HBT's gain.

Figure 4:
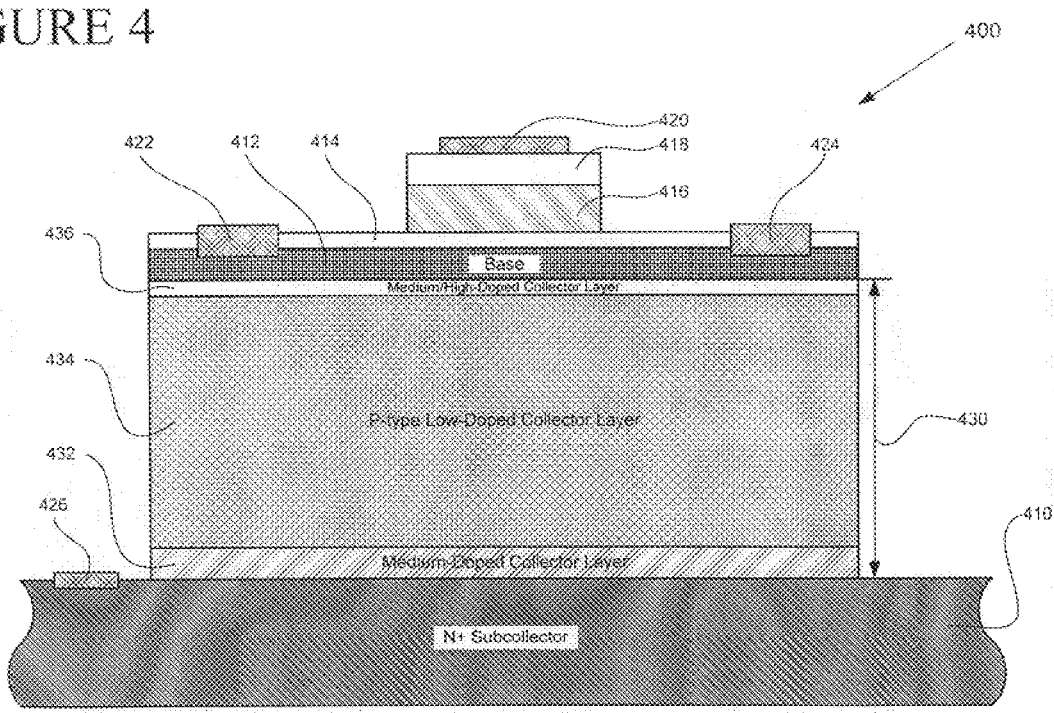
FIG. 4 illustrates a cross sectional view of some of the features of a HBT fabricated in accordance with one embodiment of the present invention.

FIG. 4 illustrates exemplary HBT structure 400, fabricated in accordance with one embodiment. Exemplary HBT structure 400 is an NPN gallium-arsenide HBT similar to exemplary HBT structure 200 in FIG. 2. Apart from its collector, i.e. collector 430, it is noted that exemplary HBT structure 400 is identical to exemplary structure 200 in FIG. 2. As such, the various components of exemplary structure 400, apart from collector 430, possess the same characteristics, composition, and function as their counterparts in exemplary HBT structure 200.

Accordingly, exemplary HBT structure 400 comprises subcollector 410, base 412, emitter 414, first emitter cap 416, and second emitter cap 418, which are respectively equivalent to subcollector 210, base 212, emitter 214, first emitter cap 216, and second emitter cap 218 of exemplary HBT structure 200. Further, emitter contact 420, base contacts 422 and 424, and collector contact 426 of exemplary HBT structure 400 are respectively equivalent to emitter contact 220, base contacts 222 and 224, and collector contact 226 of exemplary HBT structure 200.

Continuing with FIG. 4, subcollector 410 complises gallium-arsenide highly doped with silicon, for example, at between approximately $1\times10^{18}$ cm$^{-3}$ and approximately $5\times10^{18}$ cm$^{-3}$. Subcollector 410 can be between 0.5 microns to 1.0 micron thick. As shown, collector 430 comprises three different layers, namely medium-doped collector layer 432, low-doped p-type collector layer 434, and medium/high-doped collector layer 436. In the present embodiment, medium-doped collector layer 432 comprises gallium-arsenide doped with silicon at between approximately $5\times10^{16}$ cm$^{-3}$ and approximately $1\times10^{18}$ cm$^{-3}$ and is situated adjacent to heavily doped subcollector layer 410. At the interface between base 412 and collector 430 is medium/high-doped collector layer 436, which is gallium-arsenide doped with silicon at between approximately $2\times10^{16}$ cm$^{-3}$ and approximately $3\times10^{18}$ cm$^{-3}$. The thickness of medium-doped collector layer 432 can be between approximately 1000 Angstroms and 5000 Angstroms, and the thickness of medium/high-doped collector layer 436 can be approximately 500 Angstroms.

Further, as shown in FIG. 4, sandwiched between medium-doped collector layer 432 and medium/high-doped collector layer 436 is low-doped p-type collector layer 434, which also comprises gallium-arsenide. But unlike any collector layers encountered thus far in this application, low-doped p-type collector layer 434 is doped with a p-type dopant, for example, carbon. Low-doped p-type collector layer 434 can be doped with carbon at between approximately $1\times10^{15}$ cm$^{-3}$ and approximately $5\times10^{15}$ cm$^{-3}$. Other suitable dopants besides carbon can be used to dope low-doped p-type collector layer 434, including magnesium or manganese. The thickness of low-doped p-type collector layer 434 can be between approximately 0.1 micron and approximately 0.5 microns.

In one embodiment which is not illustrated, collector 430 can comprise four separate collector layers, wherein medium-doped collector layer 432 is situated over subcollector 410, and medium/high-doped collector layer 436 is situated at the interface between base 436 and collector 430. In between medium-doped collector layer 432 and medium/high-doped collector layer 436 may be situated two low-doped collector layers. The first of the two low-doped collector layer is situated over medium-doped collector layer 432 and can comprise gallium-arsenide doped with silicon at approximately $1\times10^{16}$ cm$^{-3}$. The second low-doped collector layer in the present embodiment is situated between the first low-doped collector layer and medium/high-doped collector layer 436 and can be gallium-arsenide doped with carbon at approximately $5\times10^{15}$ cm$^{-3}$. Both the first and second low-doped collector layers in present embodiment can be between approximately 0.1 micron and 0.5 microns thick.

In the embodiment illustrated in FIG. 4, medium-doped collector layer 432 averts the initiation of filamentation in heavily doped subcollector 410 by preventing the depletion region from reaching subcollector 410 prior to breakdown voltage. It is desirable for breakdown voltage to be reached when the depletion region has extended into about three-quarters of medium-doped collector layer 432. Further, the role of medium/high doped collector layer 436 is to prevent base push out by altering the electric field at the collector-base interface, thus improving the gain of the HBT.

The presence of medium/high-doped collector layer 436, as opposed to a low-doped collector layer, at the collector-base interface can hinder the desirable expansion of the depletion region. As discussed above, depletion region expansion occurs more slowly in heavier doped regions, e.g. medium/high-doped collector layer 436. Thus, in the present embodiment, the role of low-doped p-type collector layer 434 is to "compensate" for n-type medium/high-doped collector layer 436 by facilitating expansion of the depletion region. And by facilitating the depletion region's expansion, low-doped p-type collector layer 434 improves the performance of the HBT, including raising the breakdown voltage and lowering the capacitance for the device.

Thus, FIG. 4 illustrates an exemplary NPN gallium-arsenide HBT structure having a three-layered collector, wherein a medium-doped collector layer is sandwiched between a low-doped p-type collector layer and a heavily doped subcollector so as to prevent the depletion region from over-expanding and initiating filamentation or localized high current density peaks. However, the doping profile of the low-doped p-type collector is such that the depletion region is allowed to expand sufficiently to enhance the transistor's performance. The HBT illustrated in FIG. 4 further comprises a, medium/high-doped collector layer adjacent to the base, which modifies the electric field at the collector-base interface to prevent base push out and hence optimize the HBT's gain.

FIG. 5 shows a flowchart which describes an exemplary process for fabricating an NPN gallium-arsenide HBT 500 ("process 500"), in accordance with one embodiment. Certain details and steps have been left out of process 500 which are apparent to a person of ordinary skill in the art. For example, a step may consist of one or more substeps or may involve specialized equipment, as known in the art. Process 500 begins at step 500 and continues to step 502 where an N+ subcollector is formed in a gallium-arsenide substrate. The subcollector is doped with silicon and can be formed by, for example, MBE or MOCVD techniques known in the art. The silicon doping level of the subcollector can be between approximately $1\times10^{18}$ cm$^{-3}$ and approximately $5\times10^{18}$ cm$^{-3}$.

After the subcollector has been formed at step 502, process 500 proceeds to step 504 where the collector is formed. In the present embodiment, the collector comprises two separate layers, both deposited by either an MBE or a MOCVD process. The first collector layer comprises gallium-arsenide doped with silicon at between approximately $5\times10^{16}$ cm$^{-3}$ and approximately $1\times10^{18}$ cm$^{-3}$. This first layer is deposited directly on top of the heavily doped subcollector formed at step 502, and can be between approximately 1000 Angstroms and 5000 Angstroms thick. Following the deposition of the first collector layer, a second collector layer is deposited, and this second layer comprises gallium-arsenide doped with silicon at between approximately $1\times10^{16}$ cm$^{-3}$ and approximately $3\times10^{16}$ cm$^{-3}$. The second collector layer can be approximately 1.0 micron thick.

As a result of step 504, the collector in the present embodiment is made of two layers—the first is adjacent to the subcollector and is medium-doped, while the second is low-doped. Usually the second layer is an n-type collector; however, in one embodiment, the second layer is a p-type collector. In another embodiment, step 504 involves the deposition of a third collector layer on top of the low-doped collector layer, and the third collector layer is also gallium-arsenide doped with silicon at between approximately $2\times10^{16}$ cm$^{-3}$ and approximately $3\times10^{18}$ cm$^{-3}$. This third collector layer is referred to as a medium/high-doped collector layer and can be between approximately 100 and approximately 500 Angstroms thick.

After the collector has been fabricated at step 504, process 500 proceeds to step 506 where a base layer is deposited, which is between approximately 500 Angstroms and approximately 1500 Angstroms thick. The base layer can comprise gallium-arsenide doped with carbon at approximately $4\times10^{19}$ cm$^{-3}$. Following, at step 508, an emitter layer comprising either InGaP or GaAs doped with silicon at approximately $3\times10^{17}$ cm$^{-3}$ is deposited. Then at step 510, a first emitter cap layer comprising gallium-arsenide doped with silicon at approximately $4\times10^{18}$ cm$^{-3}$ is deposited on top of the emitter layer followed by the deposition of a second emitter cap layer, which comprises indium-gallium-arsenide doped with silicon at approximately $1\times10^{19}$ cm$^{-3}$. Each of these layers, i.e. the base layer, the emitter layer, and the first and second emitter cap layers, are formed in a manner known in the art, for example by an MBE or MOCVD process.

At step 512 of process 500, an emitter contact is patterned over the second emitter cap layer and is situated directly over the HBT's active region. Continuing with process 500, at step 514, the mesa is masked and etched down to the n-type emitter layer and base contacts are patterned in to the base layer. Thereafter, at step 516, the mesa is masked and further etched down to the subcollector. In one embodiment, the mesa is etched only down to the collector. Also at step 516, following the etching of the mesa, a collector contact is patterned onto the subcollector. The various steps of masking and etching are done in a manner well known in the art. Exemplary process 500 for fabricating an NPN gallium-arsenide HBT then ends at step 518.

It is appreciated by the above detailed disclosure that this invention provides method for fabrication of heterojunction bipolar transistors in which the collector comprises a plurality of differently doped collector layers so as to prevent filamentation or localized current from occurring in the device. In one embodiment, the formation of a medium-doped collector layer adjacent to the heavily doped subcollector impedes the expansion of the depletion region such that breakdown voltage is reached prior to the depletion region reaching the subcollector. Although the invention is described as applied to the construction of gallium-arsenide NPN HBT, it will be apparent to a person of ordinary skill in the art how the invention can be applied in similar situations where it is desirable to reduce the filamentation in a PNP device, or any other type of HBT device.

From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, it is appreciated that that other types of dopants such as tellurium and selenium can be used to dope the various collector layers instead of silicon. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method and structure for a heterojunction bipolar transistor have been described.

What is claimed is:

1. A method for fabricating a HBT, said method comprising steps of:
   forming a subcollector;
   fabricating a collector over said subcollector, said collector comprising a medium-doped collector layer adjacent to said subcollector and a low-doped collector layer over said medium-doped collector layer, said medium-doped collector layer being uniformly doped;
   growing a base over said collector;
   depositing an emitter over said base.

2. The method of claim 1 wherein said medium-doped collector layer comprises GaAs doped with silicon at between approximately $5\times10^{16}$ cm$^{-3}$ and approximately $1\times10^{18}$ cm$^{-3}$.

3. The method of claim 2 wherein said medium-doped collector layer is between approximately 1000 Angstroms and approximately 5000 Angstroms thick.

4. The method of claim 1 wherein said low-doped collector layer comprises GaAs doped with silicon at between approximately $1\times10^{16}$ cm$^{-3}$ and approximately $3\times10^{16}$ cm$^{-3}$.

5. The method of claim 4 wherein said low-doped collector layer is between approximately 0.5 microns and approximately 1.0 micron thick.

6. The method of claim 1 wherein said collector further comprises a medium/high-doped collector layer deposited between said low-doped collector layer and said base.

7. The method of claim 6 wherein said medium/high-doped collector layer comprises GaAs doped with silicon at between approximately $2\times10^{16}$ cm$^{-3}$ and approximately $3\times10^{18}$ cm$^{-3}$.

8. The method of claim 7 wherein said medium/high-doped collector layer is between approximately 100 Angstroms and approximately 500 Angstroms thick.

9. The method of claim 8 wherein said low-doped collector layer comprises GaAs doped with carbon at between approximately $1 \times 10^{15}$ cm$^{-3}$ and approximately $5 \times 10^{15}$ cm$^{-3}$.

10. The method of claim 1 wherein said subcollector comprises GaAs doped with silicon at approximately $5 \times 10^{18}$ cm$^{-3}$.

11. The method of claim 1 wherein said base comprises GaAs doped with carbon at approximately $4 \times 10^{19}$ cm$^{-3}$.

12. The method of claim 1 wherein said emitter comprises material selected from the group consisting of InGaP and GaAs.

13. The method of claim 12 wherein said emitter is doped with silicon at approximately $3 \times 10^{17}$ cm$^{-3}$.

14. The method of claim 1 further comprising steps of:
    forming a first and a second emitter cap layer;
    patterning metal contacts on said emitter, said base and said collector.

15. A method for fabricating a HBT, said method comprising steps of:
    forming a subcollector;
    depositing a medium-doped collector layer over said subcollector;
    depositing a P-type low-doped collector layer over said medium-doped collector layer;
    depositing a medium/high-doped collector layer over said P-type low-doped collector layer;
    growing a base over said medium/high-doped collector layer;
    depositing an emitter over said base.

16. The method of claim 15 wherein said medium-doped collector layer comprises GaAs doped with silicon at between approximately $5 \times 10^{16}$ cm$^{-3}$ and approximately $1 \times 10^{18}$ cm$^{-3}$.

17. The method of claim 15 wherein said P-type low-doped collector layer comprises GaAs doped with carbon at between approximately $1 \times 10^{15}$ cm$^{-3}$ and approximately $5 \times 10^{15}$ cm$^{-3}$.

18. The method of claim 15 wherein said medium/high-doped collector layer comprises GaAs doped with silicon at between approximately $2 \times 10^{16}$ cm$^{-3}$ and approximately $3 \times 10^{18}$ cm$^{-3}$.

19. The method of claim 15 wherein said subcollector comprises GaAs doped with silicon at approximately $5 \times 10^{18}$ cm$^{-3}$.

20. The method of claim 15 wherein said base comprises GaAs doped with carbon at approximately $4 \times 10^{19}$ cm$^{-3}$.

21. A method for fabricating a HBT, said method comprising steps of:
    forming a subcollector;
    depositing a medium-doped collector layer over said subcollector, said medium-doped collector layer being uniformly doped;
    depositing a low-doped collector layer over said medium-doped collector layer;
    depositing a medium/low-doped collector layer over said low-doped collector layer;
    growing a base over said medium/low-doped collector layer;
    depositing an emitter over said base.

22. The method of claim 21 wherein said medium-doped collector layer comprises GaAs doped with silicon at between approximately $5 \times 10^{16}$ cm$^{-3}$ and approximately $1 \times 10^{18}$ cm$^{-3}$.

23. The method of claim 21 wherein said low-doped collector layer comprises GaAs doped with silicon at between approximately $1 \times 10^{16}$ cm$^{-3}$ and approximately $3 \times 10^{16}$ cm$^{-3}$.

24. The method of claim 21 wherein said medium/low-doped collector layer comprises GaAs doped with silicon at between approximately $2 \times 10^{16}$ cm$^{-3}$ and approximately $5 \times 10^{16}$ cm$^{-3}$.

25. The method of claim 21 wherein said subcollector comprises GaAs doped with silicon at approximately $5 \times 10^{18}$ cm$^{-3}$.

26. The method of claim 21 wherein said base comprises GaAs doped with carbon at approximately $4 \times 10^{19}$ cm$^{-3}$.

27. A method for fabricating a HBT, said method comprising steps of:
    forming a subcollector;
    fabricating a collector over said subcollector, said collector comprising a medium-doped collector layer adjacent to said subcollector, a low-doped collector layer over said medium-doped collector layer, and a medium/high-doped collector layer over said low-doped collector layer, said low-doped collector layer comprising GaAs doped with carbon at between approximately $1 \times 10^{15}$ cm$^{-3}$ and approximately $5 \times 10^{15}$ cm$^{-3}$, said medium/high-doped collector layer comprising GaAs doped with silicon at between approximately $2 \times 10^{16}$ cm$^{-3}$ and approximately $3 \times 10^{18}$ cm$^{-3}$, said medium/high-doped collector layer having a thickness between approximately 100 Angstroms and approximately 500 Angstroms;
    growing a base over said collector;
    depositing an emitter over said base.

* * * * *